(12) United States Patent
Sworowski et al.

(10) Patent No.: US 7,982,558 B2
(45) Date of Patent: Jul. 19, 2011

(54) INTEGRATED SINGLE-CRYSTAL MEMS DEVICE

(75) Inventors: Marc Sworowski, Caen (FR); David D. R. Chevrie, Bretteville sur Odon (FR); Pascal Philippe, Caen (FR)

(73) Assignee: NXP B.V., Eindhoven (NL)

( * ) Notice: Subject to any disclaimer, the term of this patent is extended or adjusted under 35 U.S.C. 154(b) by 192 days.

(21) Appl. No.: 12/306,631

(22) PCT Filed: Jun. 14, 2007

(86) PCT No.: PCT/IB2007/052270
§ 371 (c)(1),
(2), (4) Date: Dec. 24, 2008

(87) PCT Pub. No.: WO2008/001253
PCT Pub. Date: Jan. 3, 2008

(65) Prior Publication Data
US 2009/0278628 A1    Nov. 12, 2009

(30) Foreign Application Priority Data
Jun. 29, 2006  (EP) ..................... 06116326

(51) Int. Cl.
*H03H 9/46* (2006.01)
*H03H 9/50* (2006.01)
*H03H 3/007* (2006.01)
*H01L 21/02* (2006.01)

(52) U.S. Cl. ........... 333/186; 333/199; 438/50; 438/51; 438/52; 438/53; 438/386; 438/411; 438/421; 438/422; 257/415; 257/E21.001; 310/309

(58) Field of Classification Search .................. 333/186, 333/199, 200; 438/48, 50, 51, 53, 52, 386, 438/404, 411, 421, 422; 310/309; 257/415, E21.001

See application file for complete search history.

(56) References Cited

U.S. PATENT DOCUMENTS

| | | | |
|---|---|---|---|
| 5,198,390 A * | 3/1993 | MacDonald et al. ........... 438/52 |
| 5,723,353 A | 3/1998 | Muenzel et al. |
| 6,121,552 A | 9/2000 | Brosnihan et al. |
| 6,136,630 A * | 10/2000 | Weigold et al. ................. 438/50 |
| 6,388,300 B1 * | 5/2002 | Kano et al. ..................... 257/419 |
| 6,391,674 B2 * | 5/2002 | Ziegler ............................ 438/52 |
| 6,429,755 B2 * | 8/2002 | Speidell et al. ............... 333/197 |
| 6,628,177 B2 | 9/2003 | Clark et al. |
| 6,856,217 B1 | 2/2005 | Clark |
| 6,905,615 B2 | 6/2005 | Fischer et al. |
| 7,023,065 B2 * | 4/2006 | Ayazi et al. .................... 257/414 |
| 7,402,449 B2 * | 7/2008 | Fukuda et al. .................. 438/53 |
| 7,566,940 B2 * | 7/2009 | Sasagawa et al. ............. 257/419 |
| 7,578,189 B1 * | 8/2009 | Mehregany ................. 73/514.18 |
| 7,618,837 B2 * | 11/2009 | Yan et al. ........................ 438/51 |

(Continued)

OTHER PUBLICATIONS

Pourkamali, Siavash, et al; "High-Q Single Crystal Silicon Harpss Capacitive Beam Resonators With Self-Aligned Sub-100-NM Transduction Gaps"; Journal of Micoroelectromechanical Sytems, vol. 12, No. 4; Aug. 2003; pp. 487-496.

(Continued)

*Primary Examiner* — Barbara Summons

(57) ABSTRACT

Method of manufacturing a MEMS device integrated in a silicon substrate. In parallel to the manufacturing of the MEMS device passive components as trench capacitors with a high capacitance density can be processed. The method is especially suited for MEMS resonators with resonance frequencies in the range of 10 MHz.

10 Claims, 11 Drawing Sheets

U.S. PATENT DOCUMENTS

| | | | |
|---|---|---|---|
| 7,659,150 B1 * | 2/2010 | Monadgemi et al. | 438/125 |
| 7,767,484 B2 * | 8/2010 | Ayazi | 438/52 |
| 2003/0037614 A1 | 2/2003 | Nguyen et al. | |
| 2004/0065940 A1 | 4/2004 | Ayazi et al. | |
| 2005/0124135 A1 | 6/2005 | Ayazi et al. | |
| 2007/0220971 A1 * | 9/2007 | Ayazi et al. | 73/504.02 |

OTHER PUBLICATIONS

Clark, John R., et al; "High-Q VHF Micromechanical Contour-Mode Disk Resonators"; pp. 493-496, IEDM Technical Digest, Electron Devices Meeting, Dec. 10-13, 2000.

Lin, Yu-Wei, et al; "Series-Resonant VHF Micromechanical Resonator Reference Oscillators"; IEEE Journal of Solid-State Circuits, vol. 39, No. 12; Dec. 2004; pp. 2477-2491.

Pourkamali, Siavash, et al; "VHF Single Crystal Silicon Capacitive Elliptic Bulk-Mode Disk Resonators—Part II: Implementation and Characterization"; Journal of Microelectromechanical Systems, vol. 13, No. 6, Dec. 2004; p. 1054-1062.

Mattila, T., et al; "12 MHZ Micromechanical Bulk Acoustic Mode Oscillator"; Elsevier; pp. 1-11; accepted for publication in Sensors and Actuators Jun. 19, 2002, available online Aug. 12, 2002.

* cited by examiner

INTEGRATED SINGLE-CRYSTAL MEMS DEVICE

The invention relates to a method of manufacturing an integrated single-crystal MEMS device.

U.S. Pat. No. 6,856,217B 1 discloses a Micro-Electromechanical-System (MEMS) device based upon a radially or laterally vibrating disk structure and capable of vibrating at frequencies well past 100 MHz. The center of the disk is a nodal point, so when the disk resonator is supported at its center, anchor dissipation to the substrate is minimized, allowing this design to retain high-Q at high frequency. In addition, this design retains high stiffness at high frequencies and so maximizes dynamic range. Furthermore, the sidewall surface area of this disk resonator is often larger than that attainable in previous flexural-mode resonator designs, allowing this disk design to achieve a smaller series motional resistance than its counterparts when using capacitive (or electrostatic) transduction at a given frequency. The frequency and dynamic range attainable by this resonator makes it applicable to high-Q RF filtering and oscillator applications in a wide variety of communication systems. Its size also makes it particularly suited for portable, wireless applications, where if used in large numbers, such a resonator can greatly lower the power consumption, increase robustness, and extend the range of application of high performance wireless transceivers. In addition a method is disclosed to manufacture the MEMS device. Silicon on Insulator (SOI) wafers are needed in order to process the MEMS device. These SOI wafers are expensive especially if the MEMS device is a resonator devices resonating at frequencies of less than 50 MHz since thick silicon layers are needed in order to provide the mechanical stability of the resonating (disc) structure. An integration of passive components especially capacitors with high capacitance density is not possible.

It's an objective of the current invention to provide a cost effective method for manufacturing MEMS devices enabling the integration of passive components on one substrate. The objective is achieved by means of a method of manufacturing a MEMS device, which method comprises the steps of:
 providing a device substrate with a top side and a bottom side;
 providing at least one trench in the top side of the device substrate defining the shape of a moveable structure;
 providing at least one electrically conductive area on the top side of the device substrate and at least parts of the electrically conductive area form at least one moveable electrode attached to the moveable structure;
 providing a dielectric layer on the top side of the device substrate at least partly covering the electrically conductive area;
 providing and structuring an electrically conductive electrode layer on the top side of the device substrate;
 providing at least one anchor point in the dielectric layer;
 providing and structuring an electrically conductive structural layer on the top side of the device substrate and the electrically conductive structural layer anchors the moveable structure at the anchor point;
 partly removing the dielectric layer through the structured structural layer;
 removing the device substrate from the bottom side of the device substrate in a defined area underneath the trench defining the shape of the moveable structure at least until the trench defining the shape of the moveable structure is reached and
 releasing the moveable structure.

In comparison to prior art the moveable structure is released in three steps. In a first step the dielectric layer is partly removed up to a defined depth in the trenches defining the shape of the moveable structure by e.g. time controlled etching. The time is determined by the etch rate of the dielectric layer, the geometry of etch holes in the structural layer and the final thickness of the moveable structure. In a second step the device substrate is removed underneath the trenches defining the shape of the moveable structure. The etching time of this second step defines the thickness of the moveable structure. The etching of the backside and the etching of the dielectric layer have to be adapted in a way that the etchant used during backside etching doesn't reach the cavities left after the etching of the dielectric layer. The depth up to where the dielectric layer has been removed in the trenches has to be less than the final thickness of the moveable structure. In a third step the residues of the dielectric layer preventing the contamination of the cavities left after the etching of the dielectric layer with the etchant used for backside etching are removed in order to release the moveable structure. The thickness of the moveable structure can easily be adapted to the mechanical boundary conditions determined by the extension of the moveable structure since the moveable structure is formed by means of the device substrate in contrast to prior art where the moveable structure is part of the SOI layer. The extension of the moveable structure is one decisive parameter to determine the resonance frequency of the moveable structure. Other parameters are the density, Young's modulus and poisons ratio of material building the moveable structure. Especially at resonance frequencies below 50 MHz resulting in rather large moveable structures this method provides a decisive cost advantage in comparison to resonant MEMS devices manufactured by means of SOI wafers. The moveable structure is anchored by means of the structural layer at that area or areas where the dielectric layer has been structured in order to provide the anchor point or if more than one is needed the anchor points. The electrically conductive structural layer provides a suspension for the moveable structure on the one side and an electrically conductive connection to the moveable electrode attached to the moveable structure on the other side. The moveable electrode is in interaction with an essentially static reference electrode formed by means of parts of the structured electrode layer.

A further advantage of the method described above is that trench capacitors can be manufactured in parallel. Additional trenches can be provided on the topside of the device substrate. The surface of these trenches belongs to the conductive areas on the topside of the device substrate and forms a first electrode of the trench capacitor. The surface of the trenches is covered with the dielectric layer. The electrically conductive electrode layer fills the trenches covered with the dielectric layer forming a second electrode. These stacked structure of the first electrode, the dielectric layer and a second electrode can be used as capacitor whereby the capacitance density is determined by the thickness of the dielectric layer and the effective area of the capacitive structure. Consequently the MEMS device can be manufactured in parallel with integrated capacitors with high capacitance density. Adding further layers of defined electrical conductivity enables the integration of resistors and inductors in addition. The combination of front side etching (etching the dielectric layer) and backside etching of the device substrate can further be used to provide through vias through the device substrate. After the trenches have been opened from the backside an electrically conductive contact layer can be provided from the backside. This contact layer is in physical contact with the electrode layer provide from the front side of the device substrate resulting in an electrically conductive connection between the front side of the device substrate and the backside of the device substrate forming a so called through via. The through vias enable the electrical connection of the MEMS device (and other passive circuit components) with further active or passive circuitry on a second substrate. The MEMS device can easily be stacked on the second substrate.

In a further embodiment of the current invention a sacrificial layer is provided after the deposition and structuring of the electrode layer. The sacrificial layer can be deposited before or after structuring of the dielectric layer. If the sacrificial layer can be removed by the same etchant as the dielectric layer it is preferably etched at a higher etching rate than the dielectric layer. The sacrificial layer is essentially removed before the dielectric layer is etched and the parts of the dielectric layer previously covered by the sacrificial layer are exposed to the etchant essentially at the same time. The part of the dielectric layer provided essentially parallel to the surface of the device substrate is etched first enabling a better control of the etching of the dielectric layer provided at the sides of the trenches (essentially perpendicular to the surface of the device substrate). The dielectric layer can be a oxide layer thermally grown on a silicon device substrate enabling excellent control about the thickness of the dielectric layer especially in the trenches and the sacrificial layer is a deposited silicon oxide layer of lower density and consequently higher etching rate with respect to an e.g. buffered oxide etch (BOE) in comparison to the thermally grown silicon oxide.

In another embodiment of the current invention a sacrificial layer is provided that can be removed with a first etchant and the first etchant essentially doesn't remove the dielectric layer and the dielectric layer can be removed with a second etchant and the second etchant essentially doesn't remove the sacrificial layer whereby essentially doesn't remove means that the etch rate is of the layer with respect to the etchant is at least 2 decades lower. In this case the sacrificial layer is etched first until the dielectric layer covering the topside of the moveable structure is etched free. In a second etch step the dielectric layer is removed whereby the part of the dielectric layer covering the topside of the moveable structure is essentially removed first by the etchant before the dielectric layer in the trenches is exposed to the etchant. The etching time is determined by the etching of the dielectric layer in the trenches enabling an excellent control about the etching depth in the trenches that means how far is the dielectric layer removed in the trenches. The dielectric layer can again be provided by thermal oxidation of a silicon device substrate that can be etched by a buffered oxide etch whereby the sacrificial layer can be silicon nitride that can be etched by means of phosphoric acid at elevated temperature.

In a further embodiment of the current invention the MEMS device is encapsulated on the topside of the device substrate and a vacuum is provided before a packaging substrate is bonded to the bottom side of the device substrate. The air causing damping of the moveable structure is evacuated resulting e.g. in a high-Q resonator. The encapsulation layer can be silicon oxide, silicon nitride or an organic material. The etch holes for etching the dielectric layer or the sacrificial layer and the dielectric layer have to be positioned in a way that the deposition of the encapsulation layer does not disturb the mobility of the moveable structure. Preferably no material should be deposited on top of the moveable structure. If etch holes are provided above the resonator structure in order to enable a faster etching of the dielectric layer or the sacrificial layer the etch hole have to be positioned around the areas where the moveable structure is anchored or suspended by means of the electrically conductive structural layer. The encapsulation layer is partly deposited around the anchor essentially without influencing the mobility of the moveable structure. As long as there is no structure on the bottom side of the device wafer or on the packaging wafer those have to be aligned, the packaging wafer is simply bonded to the device substrate by means of well-known wafer bonding techniques without special alignment. Alternatively to vacuum a protective gas can be provided.

It's further an objective of the current invention to provide a low cost MEMS device. The objective is achieved by means of MEMS devices comprising a device substrate with at least one reference electrode, a moveable structure comprising the same material as the device substrate and the moveable structure having at least one moveable electrode, the moveable structure is embedded in the device substrate and indirectly attached to the device substrate via at least one anchor essentially arranged above the device substrate, and a dielectric layer being removed locally so as to allow the moveable structure attached to the moveable electrode to be movable, and an electrical driving circuit is connected to the moveable electrode and the reference electrode. The moveable electrode and/or the reference electrode can be coherent electrodes or segmented electrodes. If e.g. the moveable electrode is segmented it's possible to independently apply a voltage to the different electrically isolated segments of the moveable electrode. The segments of the moveable electrode being on different electrical potential during operation have to be contacted by means of different anchor points electrically isolated from each other. The segmented moveable electrode can e.g. be used to stimulate different resonant modes if the moveable structure is used as a resonator. Preferably single crystal silicon is used as device substrate. Single crystal silicon is more attractive material compared to polysilicon due to its low internal friction and consequently higher mechanical quality factor, low internal stress and independence from various process parameters in comparison to SOI layers.

In a further embodiment the MEMS device is combined with a capacitive structure. The capacitive structure comprises a multitude of trenches in the device substrate. The surface of the trenches is electrically conductive e.g. doped silicon if a single crystal silicon device substrate is used forming a first electrode of the capacitive structure. The dielectric layer that is partly removed in order to release the moveable structure builds the isolating layer between the first electrode and the structured electrode layer forming the second electrode of the capacitive structure. The combination of the MEMS device together with the capacitive structure can be used to e.g. design integrated sensor circuits or oscillator circuits. In the first case the moveable structure can be e.g. a test mass for sensing acceleration. In the second case the moveable structure is a mechanical resonator structure whereby preferably one resonant mode of the resonator structure is stimulated and sensed by means of the moveable electrode and the reference electrode. The geometrical shape of the resonator structure in combination with Poisson's ratio and the Young's modulus determine the resonance frequencies of the resonator structure. Preferable geometric shapes of the resonator structure are discs or square plates.

The present invention will now be explained in greater detail with reference to the figures, in which similar parts are indicated by the same reference signs, and in which.

Figure 1A:
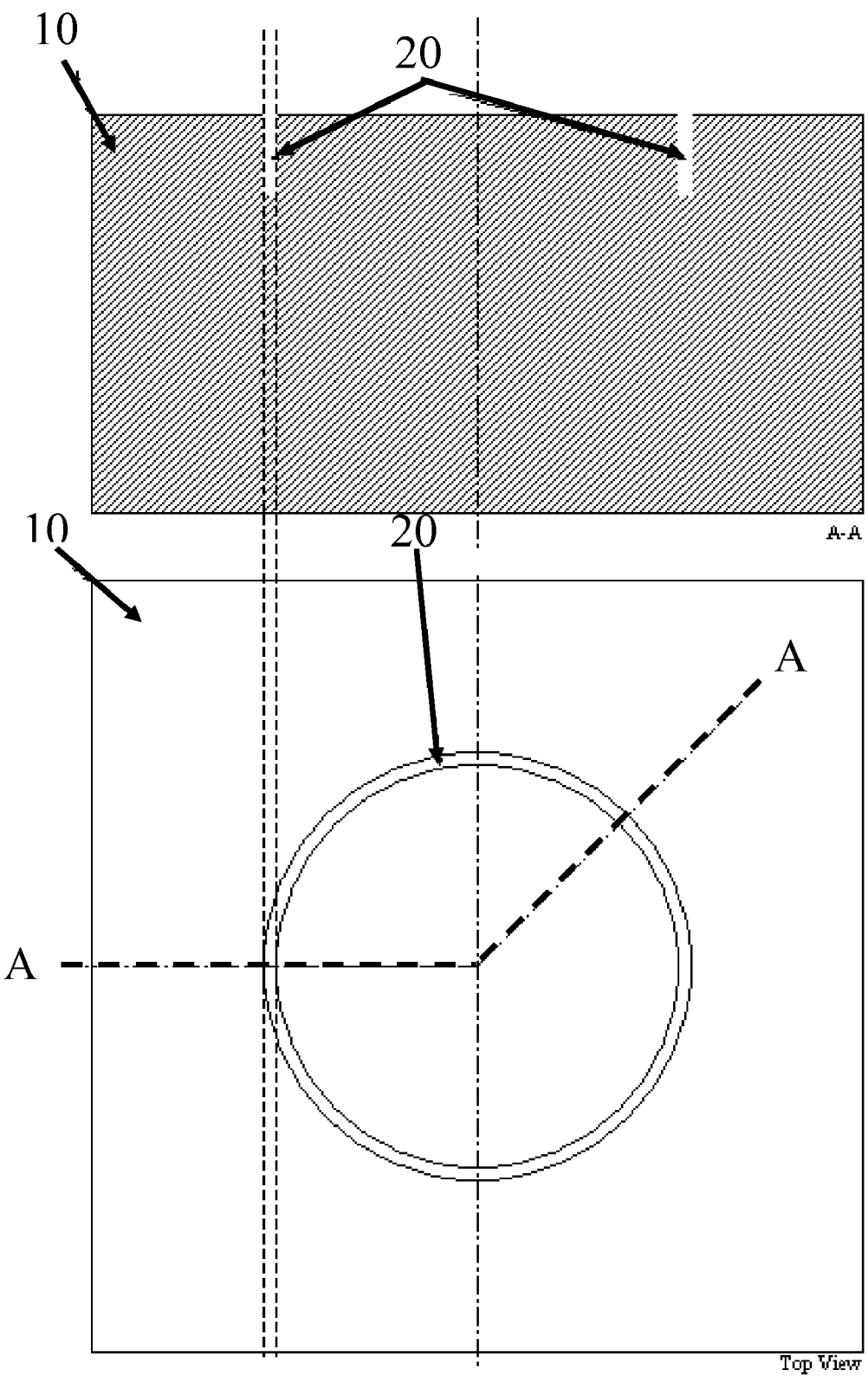
FIGS. 1a-1i illustrate the different stages of the method of manufacturing a MEMS device according to one embodiment of the current invention.
Figure 1B:
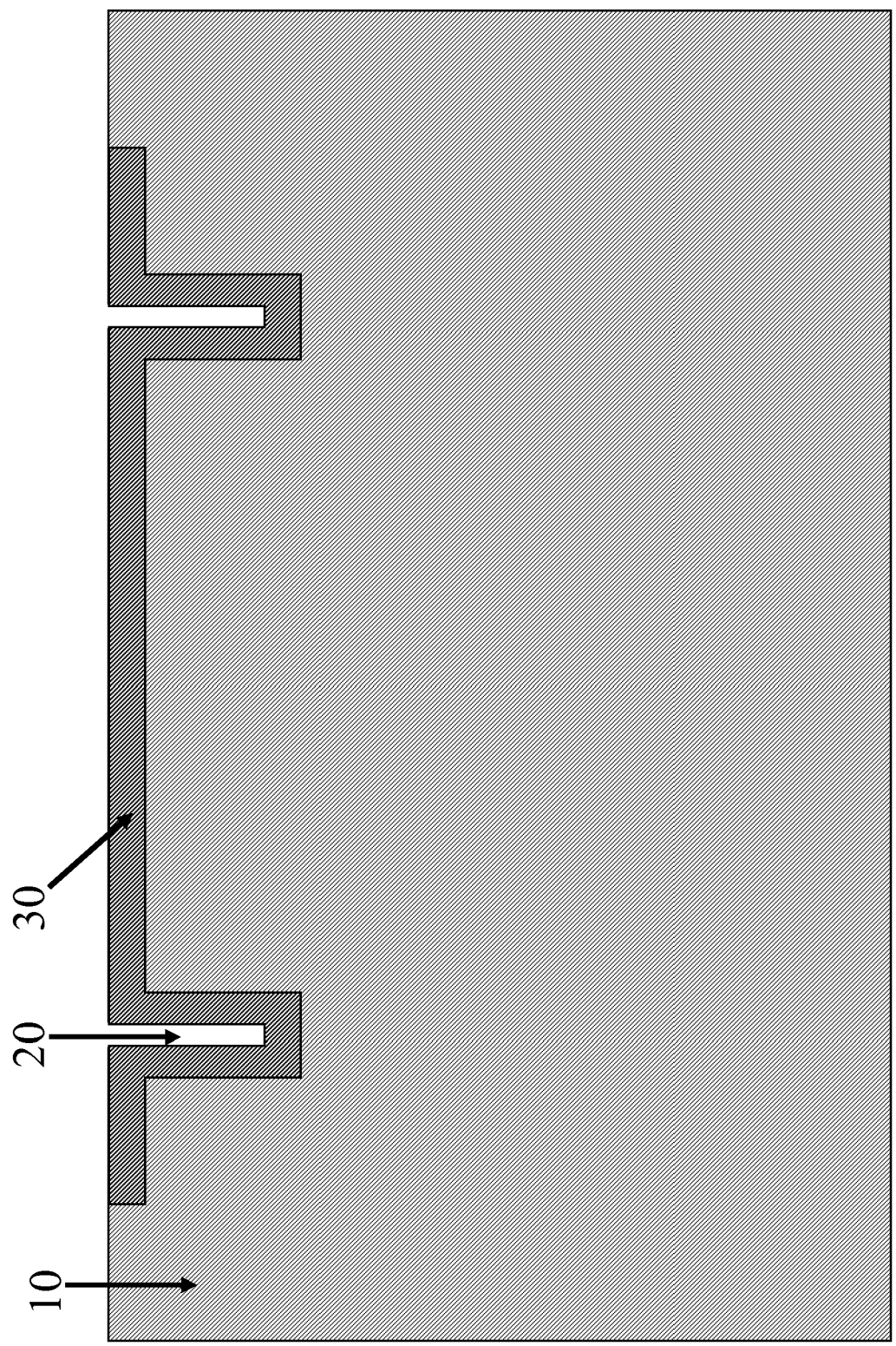
Figure 1C:
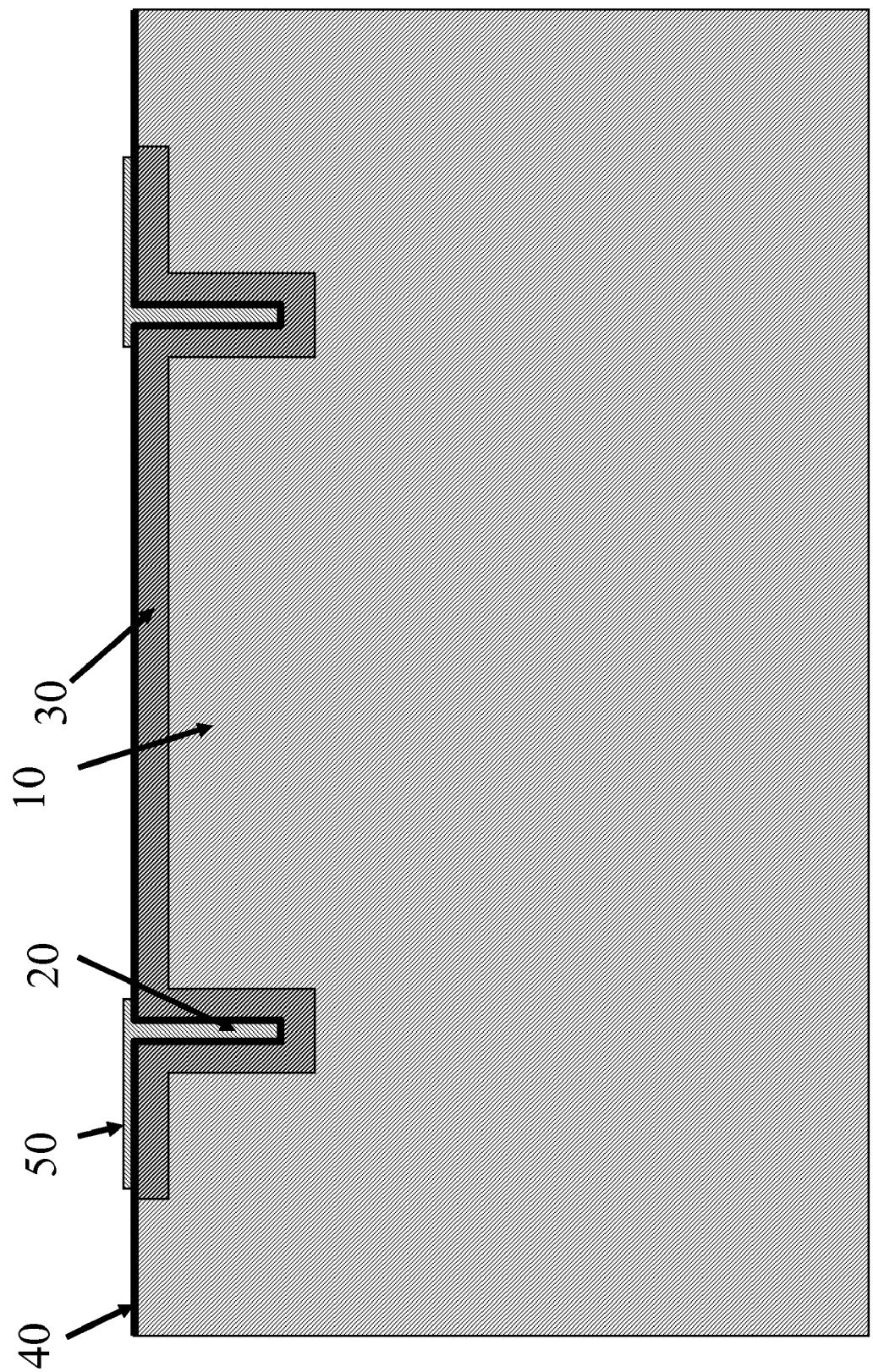
Figure 1D:
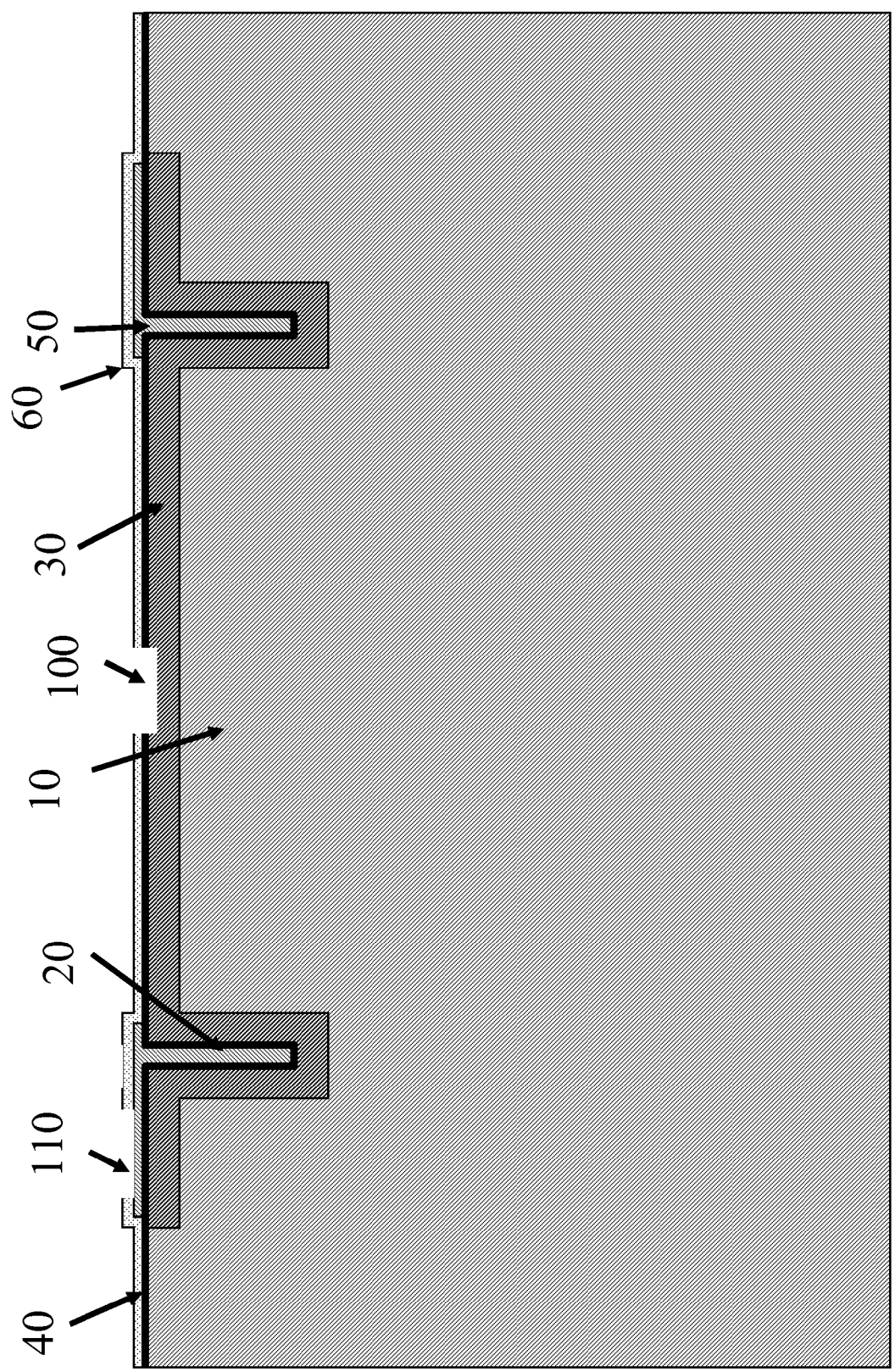
Figure 1E:
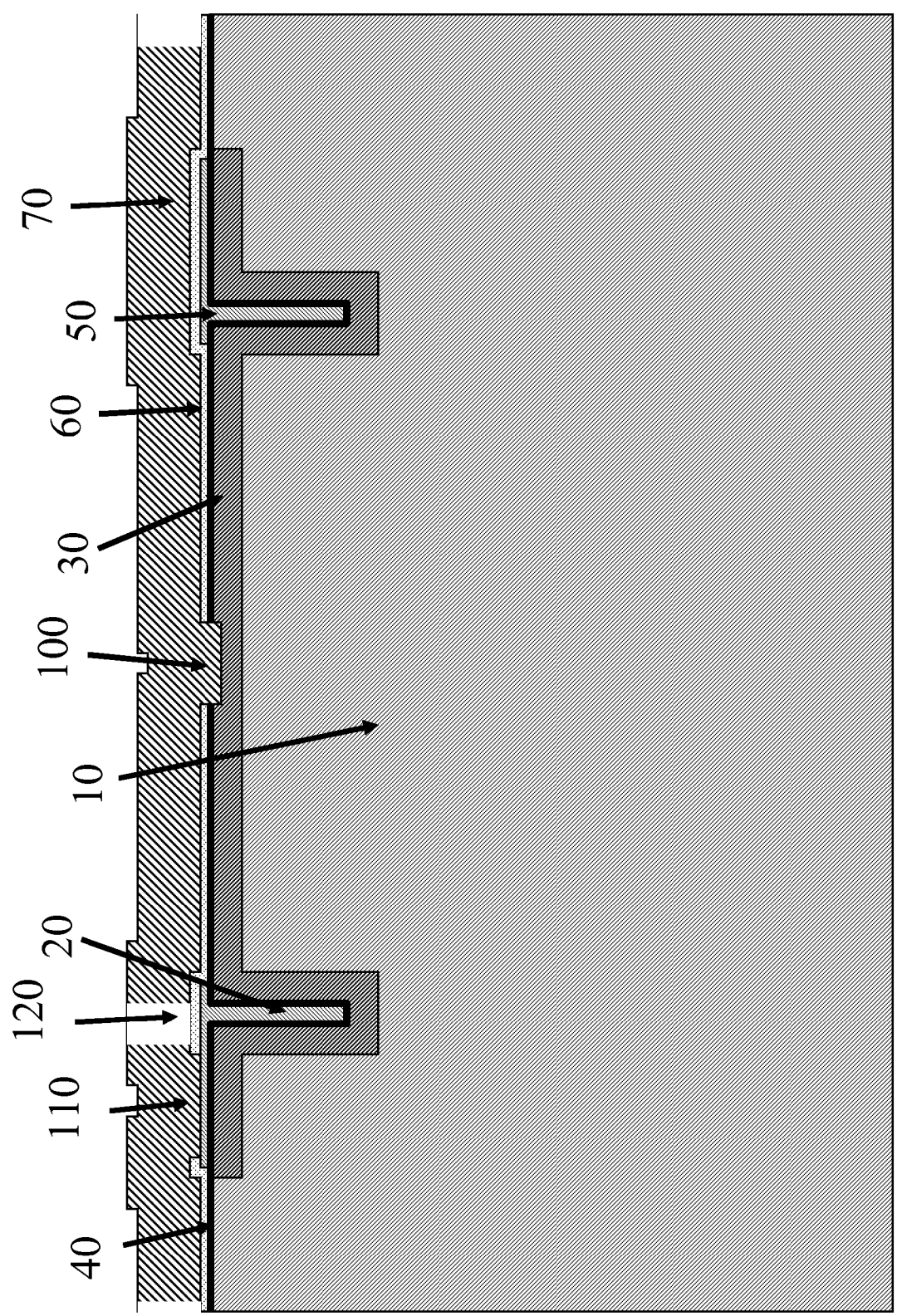
Figure 1F:
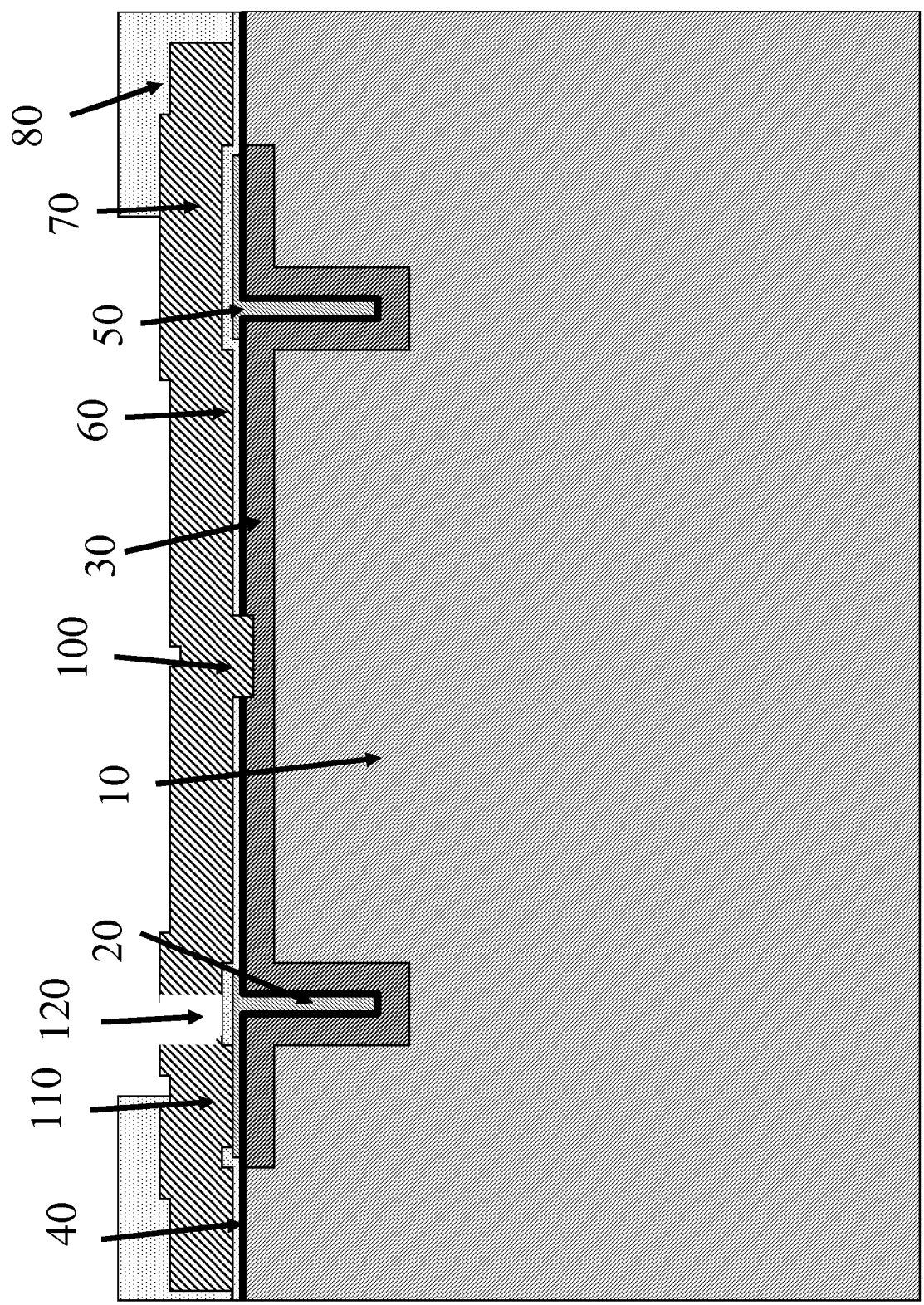
Figure 1G:
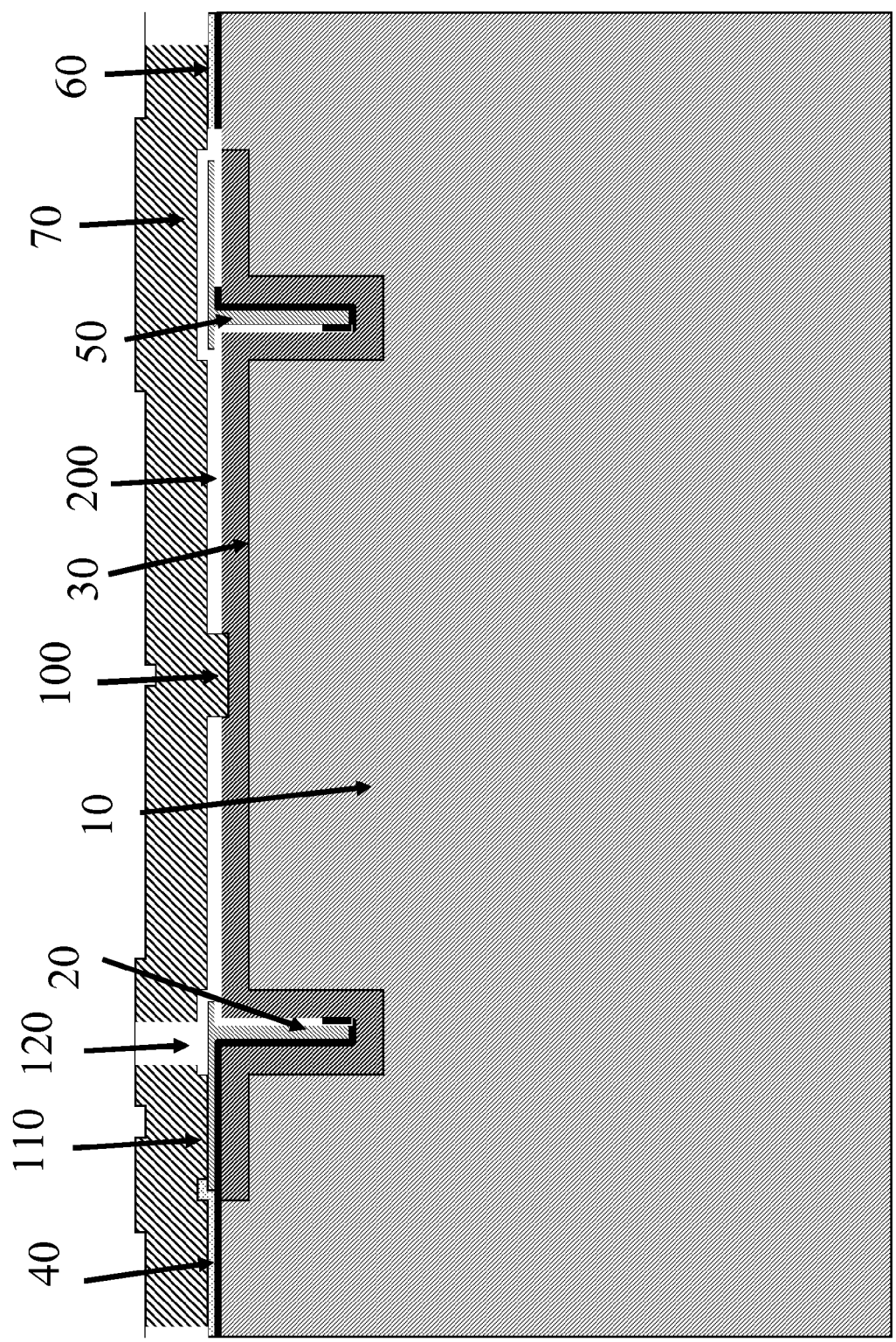
Figure 1H:
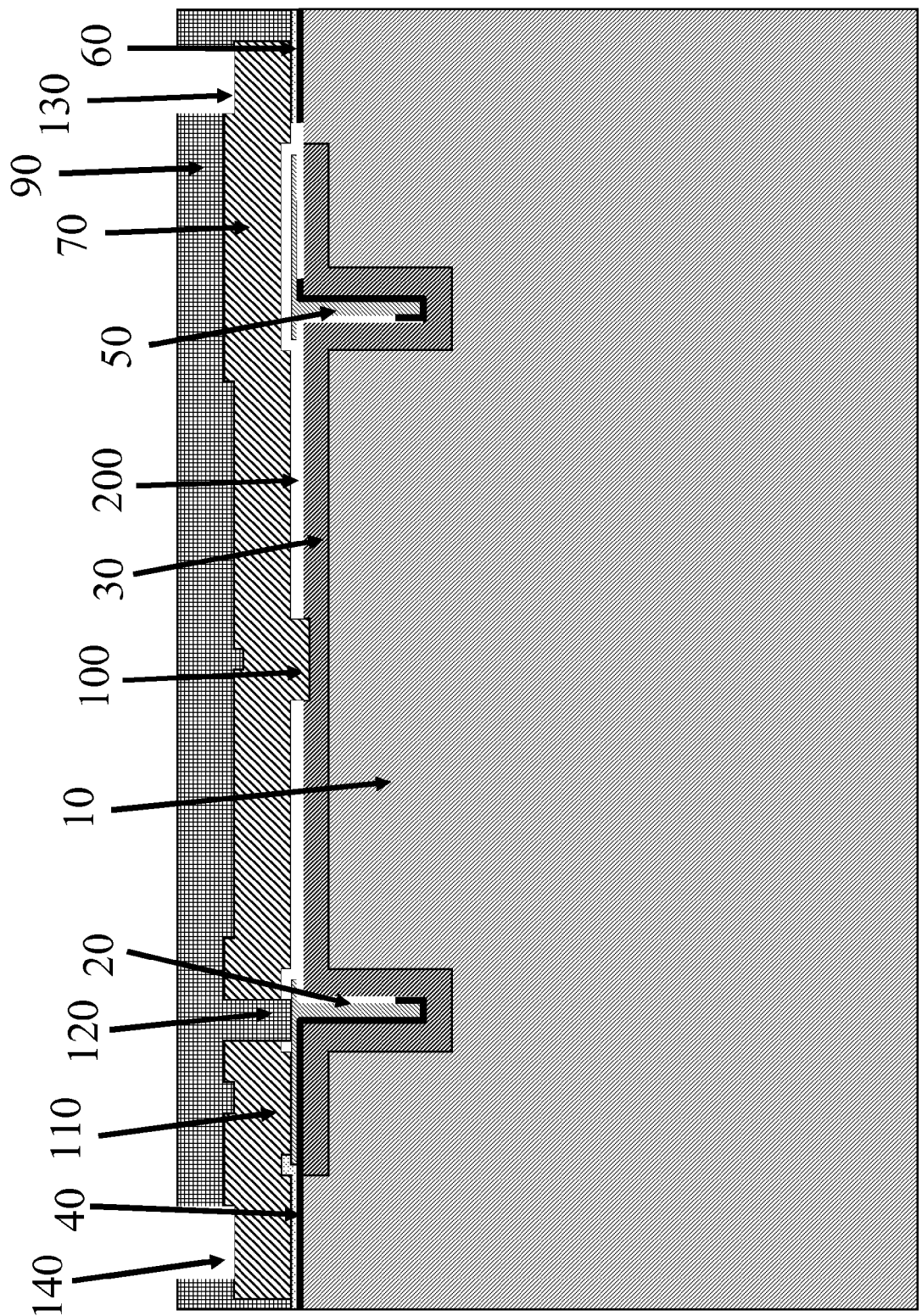
Figure 1I:
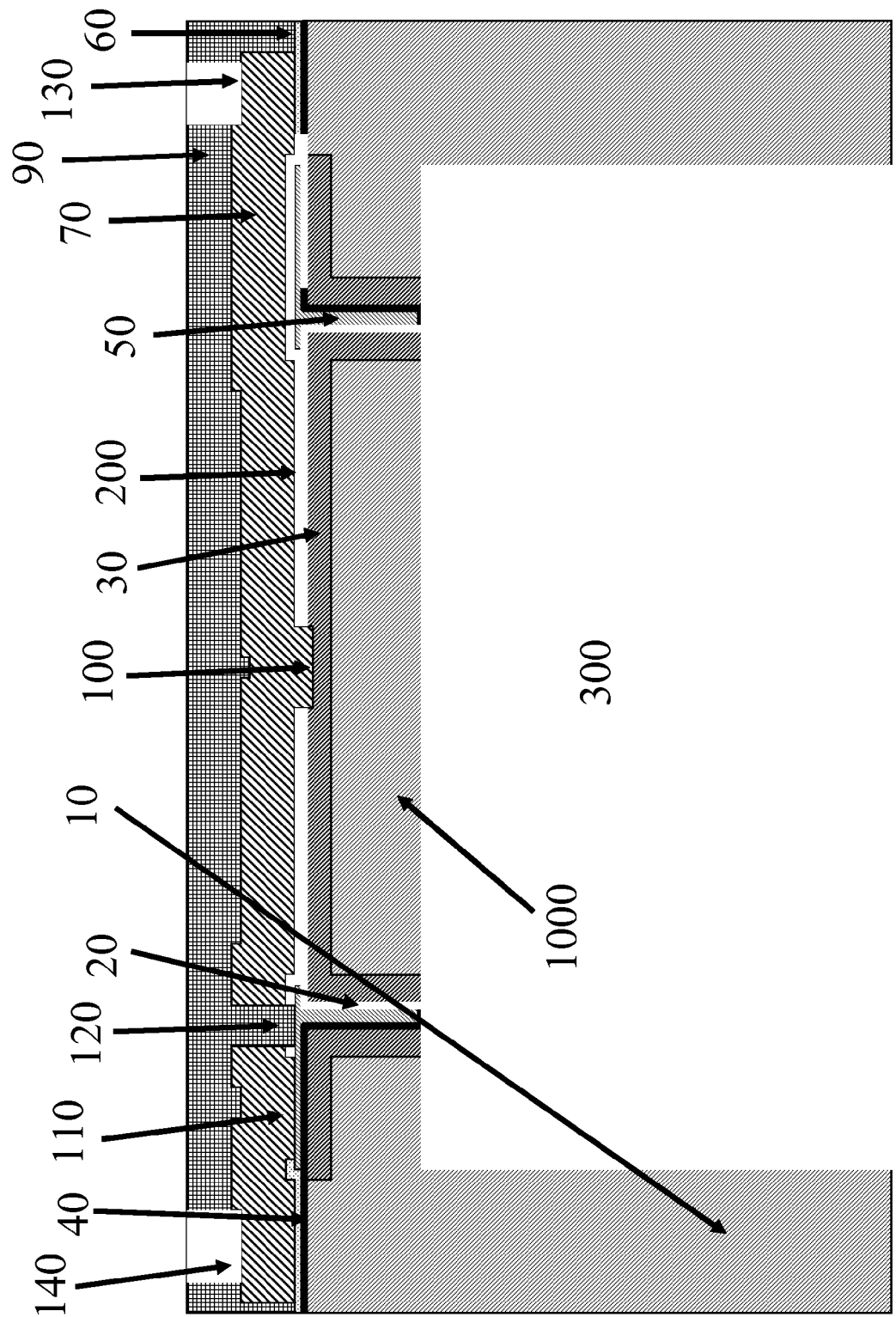

FIG. 1a shows a silicon device substrate 10 after a circular trench 20 is etched in the topside of the device substrate 10 by means of Deep Reactive Ion Etching (DRIE). The lower picture in FIG. 1a shows a top view of the device substrate 10 with the trench 20 where the line A-A of the cross section shown in the upper picture of FIG. 1a is defined. The line A-A is no straight line. It comprises to straight parts meeting at the mid point of the circular trench 20 and enclosing an angle of around 20 degree. The trench 20 has a width of around 3 µm and a depth of around 20 µm. In FIG. 1b is depicted a cross section of the device substrate along the line A-A as defined in FIG. 1a after parts of the area of the topside of the silicon device substrate 10 including the surface of the trench 20 have been made conductive by means of doping. A part of this conductive area builds the moveable electrode 30. FIG. 1c shows the cross section of the device substrate 10 along line A-A after a thin dielectric layer 40 of SiO2 (around 50 nm) have been thermally grown on the topside of the device substrate 10, and subsequently electrically conductive doped poly silicon has been deposited building the electrode layer 50. The electrode layer 50 is structured whereby the trench 20 is filled with the electrically conductive doped poly silicon building the reference electrode. FIG. 1d shows the cross section of the device substrate 10 along line A-A after a sacrificial layer 60 around 1 µm TEOS has been deposited. The sacrificial layer 60 is structured in order to provide contact openings 110 to the structured electrode layer 50. Further the sacrificial layer 60 and the dielectric layer 40 are structured together (both layers consist of silicon oxide) providing an anchor point 100 for the moveable structure. FIG. 1e shows the cross section of the device substrate 10 along line A-A after the electrically conductive structural layer 70 is deposited on the topside of the device substrate 10 and structured. The structural layer 70 consists of doped poly silicon anchoring the moveable structure at anchor point 100. Additionally the electrically conductive doped poly silicon provides contacts to the structured electrode layer 50 building the reference electrode and to the moveable electrode 30 (via the anchor point 100) whereby both electrodes are electrically isolated from each other. Further etch holes 120 are provided for etching the sacrificial layer 60 and the dielectric layer 40. FIG. 1f shows the cross section of the device substrate 10 along line A-A after a hard mask have been provided and structured. The hard mask is removed after the sacrificial layer 60 and the dielectric layer 40 have been etched as shown in FIG. 1g. The sacrificial layer 60 and the dielectric layer 40 are etched by means of a buffered oxide etch (BOE) around the anchor point 100 via the etch holes 120. The sacrificial layer 60 etches faster than the dielectric layer 40 due to the higher density of the thermally grown silicon oxide in comparison to TEOS. Optionally further etch holes can be provide around the anchor point 100 in order to accelerate the etching of the sacrificial layer 60. By controlling the etching time the sacrificial layer 60 and the dielectric layer 40 are removed above the moveable electrode 30 and the dielectric layer 40 is partly removed in the trench 20 that means the dielectric layer is removed up to a depth of around 15 µm from the topside of the device substrate 10 at the inner surface of the trench 20 with respect to the part of the device substrate 10 circumvented by the circular trench 20. FIG. 1h shows the cross section of the device substrate 10 along line A-A after an encapsulation layer 90 has been deposited preventing short circuits. In addition contacts 130 and 140 to the electrically conductive structural layer 70 are provided through the encapsulation layer 90 in order to contact the moveable electrode 30 and the reference electrode formed by the residues of the electrode layer 50. FIG. 1i shows the cross section of the device substrate 10 along line A-A after the moveable structure 1000 has been released. First a cavity 300 is etched from the backside of the device substrate 10 underneath the area circumvented by the circular trench 20 by means of anisotropic dry etching. The etching depth of the cavity 300 is the thickness of the devices substrate 10 minus the depth of the trench 20. The trench 20 is reached but the moveable structure 1000 isn't released during backside etching. A thin residue of the dielectric layer 40 at the inner surface of the circular trench 20 protects the cavity 200 resulting from removing the sacrificial layer 60 and the dielectric layer 40. This residual of the dielectric layer 40 is removed by means of a short etch step with buffered oxide etch.

Figure 2:
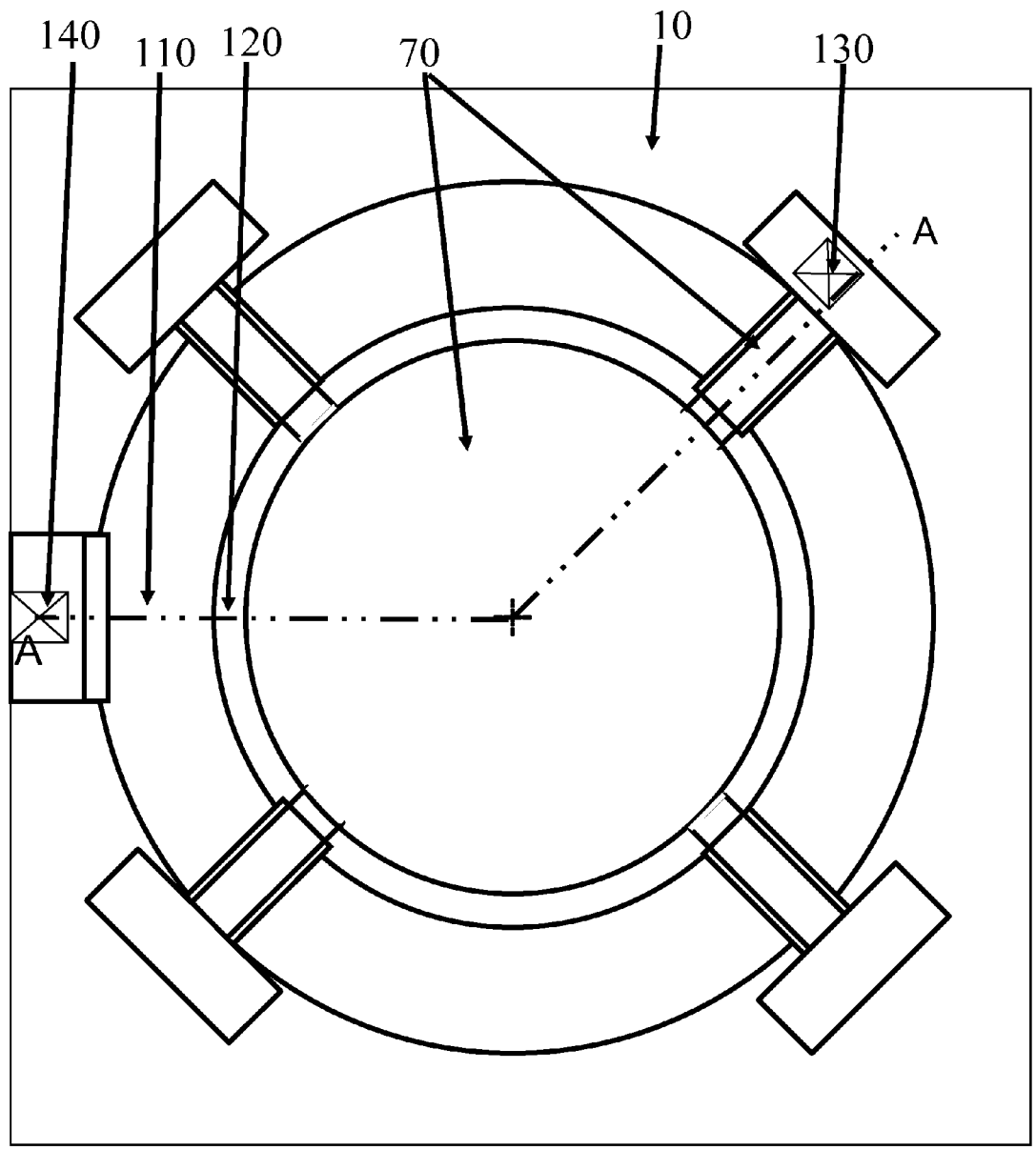
FIG. 2 shows a principal sketch of a top view of a MEMS device according to one embodiment of the current invention.

FIG. 2 shows a principal sketch of one embodiment of the current invention. A top view of a disk resonator is shown with the contact 130 to the moveable electrode via the structured structural layer 70. Contact 140 provides the electrical contact to the reference electrode via the contact area 110 between the structured structural layer 70 and the structured electrode layer 50 building the reference electrode. The structured parts of the structural layer 70 contacted to the reference electrode and the structured parts of the structural layer contacted to the moveable electrode are separated by means of the etch holes 120 in the structural layer. The etch holes 120 are finally filled with the encapsulation layer.

Figure 3:
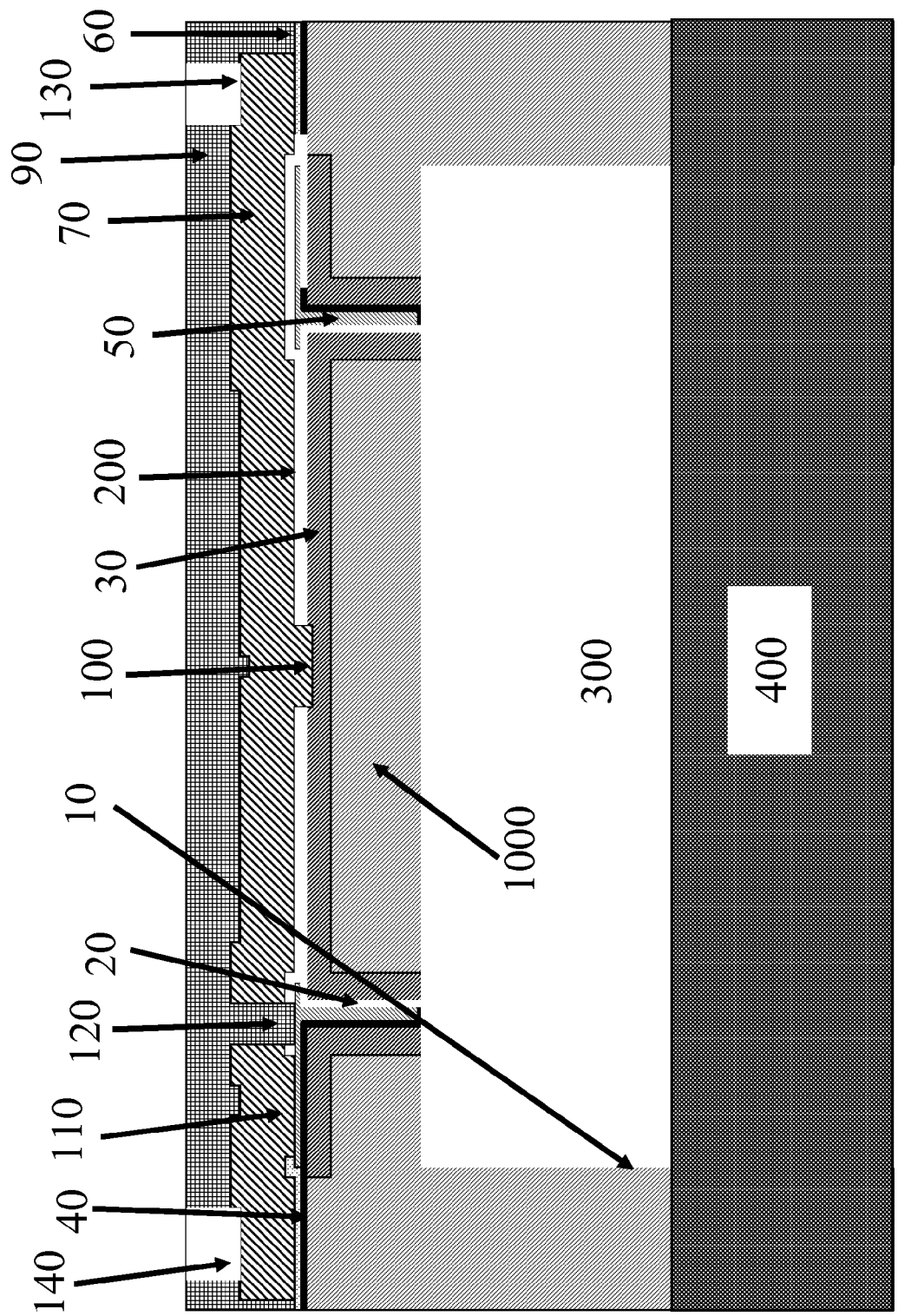
FIG. 3 shows a cross section of a MEMS device according to a further embodiment of the current invention.

FIG. 3 shows a cross section of the embodiment of the current invention shown in FIG. 1i where a packaging wafer 400 has been bonded to the backside of the device substrate 10. The moveable structure 1000 is isolated from the environment by means of the encapsulation layer 90 and the packaging wafer 400. A vacuum can be provided around the moveable structure or a protective gas. The moveable structure 1000 is the resonator structure of a MEMS resonator. The resonator structure has a disk shape and the theory about contour vibrations of isotropic circular plates gives the relation between material properties, dimensions and resonant frequencies of the disk:

$$\delta \times \frac{J_0(\delta)}{J_1(\delta)} = 1 - v,$$

where $$\delta = \omega_0 \cdot R \cdot \sqrt{\frac{\rho(1-v^2)}{E}},$$

and where R is the disk radius; $\omega_0 = 2\pi \cdot f_0$ is its angular resonance frequency; $J_n(y)$ is the Bessel function of the first kind of order n; and $\rho$, v and E are the density, Poisson's ratio and Young's modulus, respectively, e.g. of a silicon substrate.

The resonator structure is a disk fixed at its center, an reference electrode surrounding the vertical electrically conductive surface of the resonator structure building the moveable electrode 30, and an air gap between the moveable electrode and the reference electrode. As an implementation, the disk is e.g. 20 µm thick, and has an average radius of e.g. 100 µm. The air gap between moveable electrode and the reference electrode is 50 nm. Applying a voltage between moveable electrode and the reference electrode generates a radial force on the outer surface of the resonator structure that tends to extend it. In consequence, the vibrating mode is the expansion and the contraction of the disk. The potential of such a resonator can be demonstrated by estimating the performance according to the theory about contour vibrations of isotropic circular plates. All of them can be calculated from known parameters such as dimensions or single-crystal silicon material parameters (Table 1). The expected Q is in the range of 10000-100000.

TABLE 1

Parameters used in calculation. Single-crystal silicon is assumed to be isotropic.

| Parameter | Symbol | Value |
|---|---|---|
| Young's Modulus of single-crystal silicon | E | 150 GPa |
| Poisson's Ratio of single-crystal silicon | $\nu$ | 0.3 |
| Density of single-crystal silicon | $\rho$ | 2330 kg/m3 |
| Free-space Permittivity | $\epsilon_0$ | 8.854e-12 F/m |
| Relative Permittivity | $\epsilon_r$ | 1 |
| Disk height | h | 20 μm |
| Disk Radius | R | 100 μm |
| Air Gap Thickness | d | 50 nm |

Values of Table 1 lead to the resonance frequency of the fundamental mode of $f_0$=27 MHz.

The present invention is described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, first, second and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The invention claimed is:

1. Method of manufacturing a MEMS device, which method comprises the steps of:
   providing a device substrate with a top side and a bottom side;
   providing at least one trench in the top side of the device substrate defining the shape of a moveable structure;
   providing at least one electrically conductive area on the top side of the device substrate and at least parts of the electrically conductive area form at least one moveable electrode attached to the movable structure;
   providing a dielectric layer on the top side of the device substrate at least partly covering the electrically conductive area;
   providing and structuring an electrically conductive electrode layer on the top side of the device substrate;
   providing at least one anchor point in the dielectric layer;
   providing and structuring an electrically conductive structural layer on the top side of the device substrate and the electrically conductive structural layer anchors the moveable structure at the anchor point;
   partly removing the dielectric layer through the structured structural layer;
   removing the device substrate from the bottom side of the device substrate in a defined area underneath the trench defining the shape of the moveable structure at least until the trench defining the shape of the moveable structure is reached and
   releasing the moveable structure.

2. Method of manufacturing a MEMS device according to claim 1, which method comprises the additional steps of:
   providing a sacrificial layer on top of the structured electrode layer;
   structuring the sacrificial layer and
   partly removing the sacrificial layer and the dielectric layer through the structured structural layer.

3. Method of manufacturing a MEMS device according to claim 2, whereby the dielectric layer and the sacrificial layer can be removed with the same etchant and the etching rate of the sacrificial layer with respect to the etchant is higher than the etching rate of the dielectric layer with respect to the etchant.

4. Method of manufacturing a MEMS device according to claim 3, whereby the device substrate is a silicon substrate, the dielectric layer is thermally grown silicon oxide and the sacrificial layer is deposited silicon oxide.

5. Method of manufacturing a MEMS device according to claim 2, whereby the sacrificial layer can be removed with a first etchant and the first etchant essentially doesn't remove the dielectric layer and the dielectric layer can be removed with a second etchant and the second etchant essentially doesn't remove the sacrificial layer.

6. Method of manufacturing a MEMS device according to claim 5, whereby the device substrate is a silicon substrate, the dielectric layer is thermally grown silicon oxide and the sacrificial layer is deposited silicon nitride.

7. Method of manufacturing a MEMS device according to claim 1, which method comprises the additional steps of:
   encapsulating the top side of the device substrate;
   providing a vacuum;
   providing a packaging substrate and
   bonding the packaging substrate to the bottom side of the device substrate.

8. A MEMS device comprising a device substrate with at least one reference electrode, a moveable structure comprising the same material as the device substrate and the moveable structure having at least one moveable electrode, the moveable structure is embedded in the device substrate and indirectly attached to the device substrate via at least one anchor essentially arranged above the device substrate, and a dielectric layer being removed locally so as to allow the moveable structure attached to the moveable electrode to be movable, an electrical driving circuit is connected to the moveable electrode and the reference electrode, and a capacitive structure electrically connected to the moveable electrode and/or the reference electrode, the capacitive structure comprises a multitude of trenches in the device substrate, and the surface of the trenches is electrically conductive forming a first electrode of the capacitive structure, and the capacitive structure further comprises the dielectric layer and a second electrode comprising the same material as the reference electrode.

9. A MEMS device as claimed in claim 8, wherein the MEMS device is a MEMS resonator.

10. A MEMS resonator as claimed in claim 9, wherein the moveable structure comprises an essentially disk shape.

* * * * *